(12) United States Patent
Fujita et al.

(10) Patent No.: US 9,276,171 B2
(45) Date of Patent: Mar. 1, 2016

(54) NITRIDE SEMICONDUCTOR LIGHT-EMITTING DIODE

(71) Applicant: Panasonic Corporation, Osaka (JP)

(72) Inventors: Toshiyuki Fujita, Osaka (JP); Toshiya Yokogawa, Nara (JP); Akira Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 9 days.

(21) Appl. No.: 14/292,942

(22) Filed: Jun. 2, 2014

(65) Prior Publication Data

US 2014/0353699 A1 Dec. 4, 2014

(30) Foreign Application Priority Data

Jun. 3, 2013 (JP) .................................. 2013-116804

(51) Int. Cl.
  *H01L 33/00* (2010.01)
  *H01L 33/20* (2010.01)
  *H01L 33/16* (2010.01)

(52) U.S. Cl.
  CPC ............. *H01L 33/20* (2013.01); *H01L 33/0095* (2013.01); *H01L 33/16* (2013.01)

(58) Field of Classification Search
  CPC ........ H01L 33/20; H01L 3/16; H01L 33/0095
  See application file for complete search history.

(56) References Cited

U.S. PATENT DOCUMENTS

| 8,314,434 B2* | 11/2012 | Lin ........................ H01L 27/153 257/88 |
| 2005/0035355 A1 | 2/2005 | Konno et al. |
| 2006/0011935 A1* | 1/2006 | Krames ................... H01L 33/02 257/99 |
| 2009/0159870 A1* | 6/2009 | Lin ......................... H01L 33/20 257/13 |
| 2009/0162959 A1* | 6/2009 | Hsu ......................... H01L 33/20 438/33 |
| 2010/0090240 A1* | 4/2010 | Tamboli .............. H01L 33/0062 257/98 |
| 2010/0210046 A1* | 8/2010 | Kao ....................... H01L 33/385 438/26 |
| 2011/0215296 A1* | 9/2011 | Murai ..................... H01L 33/22 257/13 |
| 2013/0146928 A1 | 6/2013 | Inoue et al. |
| 2015/0024524 A1* | 1/2015 | Yao ........................ H01L 27/156 438/26 |

FOREIGN PATENT DOCUMENTS

| JP | 2005-026395 A | 1/2005 |
| JP | 2009-123969 A | 6/2009 |
| JP | 2012-023249 A | 2/2012 |
| JP | 2013-38208 | 2/2013 |
| WO | 2012/137406 | 10/2012 |

* cited by examiner

*Primary Examiner* — Victor A Mandala
(74) *Attorney, Agent, or Firm* — McDermott Will & Emery LLP

(57) ABSTRACT

Provided is a nitride semiconductor light-emitting diode having a higher light extraction efficiency and a higher polarization degree. A nitride semiconductor light-emitting diode according to the present invention comprises an active layer generating a polarized light, a first side surface, a second side surface, a third side surface, and a fourth side surface. The first and second side surfaces consist only of a plane including the Z-axis and the Y-axis. The third and fourth side surfaces are perpendicular to the first and second side surfaces and include the X-axis. The third and fourth side surfaces include an inclined surface.

8 Claims, 12 Drawing Sheets

NITRIDE SEMICONDUCTOR LIGHT-EMITTING DIODE

BACKGROUND

1. Field of the Invention

The present invention relates to a nitride semiconductor light-emitting diode.

2. Description of the Related Art

Recently, a nitride semiconductor light-emitting diode having a principal plane of an m-plane has been researched and developed actively. The reason is because the nitride semiconductor light-emitting diode having a principal plane of an m-plane does not have a piezoelectric field, which decreases a luminous efficiency thereof. Hereinafter, a nitride semiconductor light-emitting diode having a principal plane of an m-plane is referred to as "m-plane nitride semiconductor light-emitting diode". The m-plane nitride semiconductor light-emitting diode emits a polarized light.

Japanese Patent Laid-Open Publication No. 2013-038208 discloses an m-plane nitride semiconductor light-emitting diode which improves light extraction efficiency. FIG. 10 is a duplicate of FIG. 2 included in Japanese Patent Laid-Open Publication No. 2013-038208. As shown in FIG. 10, the disclosed m-plane nitride semiconductor light-emitting diode 10 comprises an optically-transparent substrate 11, a semiconductor layer 12, an n-electrode 13 and a p-electrode 14. The optically-transparent substrate 11 comprises four inclined surfaces S1-S4.

WO 2012/137406 discloses an m-plane nitride semiconductor light-emitting diode which improves an orientation distribution property. FIG. 11 is a duplicate of FIG. 5 included in WO 2012/137406. As shown in FIG. 11, this disclosed m-plane nitride semiconductor light-emitting diode 300 comprises a p-electrode 308, a p-type semiconductor layer 307, an active layer 306, an n-type semiconductor 306, an n-electrode 309 and a substrate 304. The substrate 304 has an inclined surface 311d which includes a c-axis.

SUMMARY

The present invention is a nitride semiconductor light-emitting diode, comprising:
an n-side electrode;
a p-side electrode;
a nitride semiconductor stacking structure formed of a plurality of nitride semiconductor layers each having a principal surface of a non-polar plane or a semi-polar plane;
an active layer which is included in the nitride semiconductor stacking structure and generates a polarized light;
a first side surface;
a second side surface;
a third side surface; and
a fourth side surface, wherein
X-axis is parallel to a polarization direction of the polarized light;
Z-axis is parallel to a normal direction of the principal surface;
Y-axis is perpendicular to both of the X-axis and the Z-axis;
the nitride semiconductor light-emitting diode comprises a light extraction surface through which the polarized light is emitted toward the outside of the nitride semiconductor light-emitting diode;
the light extraction surface has a normal line parallel to the Z-axis;
the first side surface consists only of a plane including the Z-axis and the Y-axis;
the second side surface consists only of a plane including the Z-axis and the Y-axis;
the second side surface is disposed parallel to the first side surface (150a);
the third side surface is perpendicular to the first and second side surfaces and includes the X-axis;
the fourth side surface is perpendicular to the first and second side surfaces and includes the X-axis;
the third side surface includes an inclined surface;
the fourth side surface includes an inclined surface;
the third and fourth side surfaces are symmetric with respect to a plane which includes the Z-axis and the X-axis; and
the following mathematical formulae (I), (II), and (III) are satisfied:

$$15 \text{ degrees} \leq \theta \leq 70 \text{ degrees} \quad (I)$$

$$0.1 \leq (L3 \cos \theta)/h1 \leq 0.5 \quad (II)$$

$$L2 < L1 \quad (III)$$

where
$\theta$ represents an angle formed between the inclined surface and the Z-axis in a cross-sectional view including the Z-axis and the Y-axis;
$h1$ represents a height of the nitride semiconductor light-emitting diode in the cross-section;
$L1$ represents a width of the nitride semiconductor light-emitting diode in the cross-section;
$L2$ represents a width of the light extraction surface in the cross-section; and
$L3$ represents a length of the inclined surface in the cross-section.

The present invention provides a nitride semiconductor light-emitting diode having higher light extraction efficiency and a higher polarization degree.

DETAILED DESCRIPTION OF THE EMBODIMENTS

Embodiments of the present invention are explained below with reference to the drawings.

Embodiment 1

Figure 1:
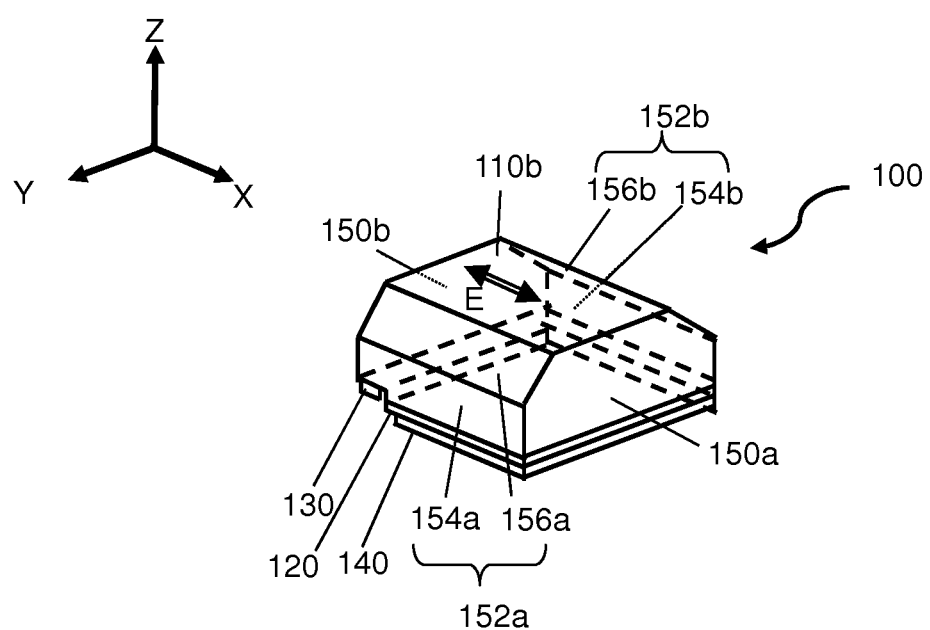
FIG. 1 shows a perspective view of a nitride semiconductor light-emitting diode 100 according to the embodiment 1.
Figure 2:
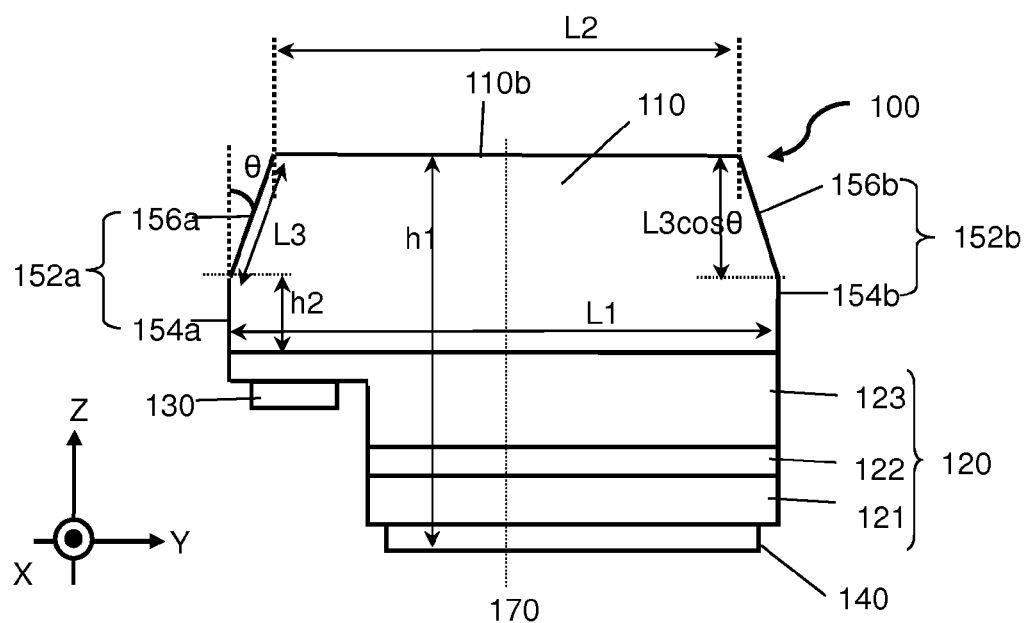
FIG. 2 shows a cross-sectional view of the nitride semiconductor light-emitting diode 100 taken along a plane including a Z-axis and a Y-axis.

FIG. 1 shows a perspective view of a nitride semiconductor light-emitting diode 100 according to the embodiment 1. FIG. 2 shows a cross-sectional view of the nitride semiconductor light-emitting diode 100 taken along a plane including a Z-axis and a Y-axis, which are described later.

As shown in FIG. 1 and FIG. 2, the nitride semiconductor light-emitting diode 100 comprises a p-side electrode 140, a nitride semiconductor stacking structure 120 and an n-side electrode 130.

As shown in FIG. 2, the nitride semiconductor stacking structure 120 has a p-type nitride semiconductor layer 121, an active layer 122 and an n-type nitride semiconductor 123. These nitride semiconductor layers have a principal plane of a non-polar plane or a semi-polar plane. An example of the non-polar plane is m-plane or a-plane. An example of the semi-polar plane is r-plane.

The p-type nitride semiconductor layer 121 is electrically connected to the p-side electrode 140. The n-type nitride semiconductor layer 123 is connected to the n-side electrode 130 electrically. The nitride semiconductor stacking structure 120 is interposed between the p-side electrode 140 and the n-side electrode 130.

The active layer 122 is interposed between the p-type nitride semiconductor layer 121 and the n-type nitride semiconductor layer 123. As shown in U.S. Pat. No. 7,858,995, when a voltage is applied between the p-side electrode 140 and the n-side electrode 130, a polarized light is produced from the active layer 122 which has a principal plane of a non-polar plane or a semi-polar plane.

Here, the polarization degree is described in more detail.

In this specification, a substrate surface on which a nitride semiconductor crystal is to be grown is referred to as the principal surface of the substrate. In a layer or region which is made of a nitride semiconductor, a surface of the layer or region in a growing direction is referred to as a growing surface or a principal surface. Light of which electric field intensity is deviated in a specific direction is referred to as "polarized light". For example, light of which electric field intensity is deviated in a direction parallel to X-axis is referred to as "X-axis direction polarized light". The direction parallel to the X-axis on this assumption is referred to as "polarization direction". Note that the "X-axis direction polarized light" not only means linearly-polarized light which is polarized in the X-axis direction but may include linearly-polarized light which is polarized in a different direction. More specifically, the "X-axis direction polarized light" means light in which the intensity (electric field intensity) of light transmitted through a "polarizer which has a polarization transmission axis extending in the X-axis direction" is higher than the electric field intensity of light transmitted through a polarizer which has a polarization transmission axis extending in a different direction. Therefore, the "X-axis direction polarized light" includes not only linearly-polarized light and elliptically-polarized light which are polarized in the X-axis direction but also a wide variety of non-coherent light in which linearly-polarized light and elliptically-polarized light which are polarized in various directions are mixed together.

While the polarization transmission axis of the polarizer is rotated around the optical axis, the electric field intensity of light transmitted through the polarizer exhibits the strongest intensity, Imax, and the weakest intensity, Imin. The polarization degree is defined by the following formula (I):

$$|Imax-Imin|/|Imax+Imin| \qquad (I)$$

In the case of the "X-axis direction polarized light", when the polarization transmission axis of the polarizer is parallel to the X-axis, the electric field intensity of the light transmitted through the polarizer is Imax. When the polarization transmission axis of the polarizer is parallel to the Y-axis, the electric field intensity of the light transmitted through the polarizer is Imin. In the case of perfectly linearly-polarized light, Imin=0, and therefore, the polarization degree is equal to 1. On other hand, in the case of perfectly unpolarized light, Imax-Imin=0, and therefore, the polarization degree is equal to 0.

As shown in FIG. 1, the nitride semiconductor light-emitting diode 100 comprises a first side surface 150a, a second side surface 150b, a third side surface 152a and a fourth side surface 152b.

As shown in FIG. 1 and FIG. 2, the nitride semiconductor light-emitting diode 100 according to the embodiment 1 comprises a substrate 110. The nitride semiconductor stacking structure 120 according to the embodiment 1 is interposed between the substrate 110 and the p-side electrode 140.

Here, the X-axis, the Y-axis and the Z-axis are defined as shown in FIG. 1 and FIG. 2.

The X-axis is parallel to a polarization direction E of the polarized light.

The Z-axis is parallel to the normal direction of the principal plane.

The Y-axis is perpendicular to both of the X-axis and the Z-axis. Needless to say, the Y-axis is perpendicular to the polarization direction E.

The X-axis, the Y-axis and the Z-axis are respectively an A-axis, a C-axis and an M-axis, when the principal plane is an m-plane. A polarized light having the polarization direction E parallel to the X-axis (namely, the A-axis) is produced from the m-plane nitride semiconductor light-emitting diode.

The X-axis, the Y-axis and the Z-axis are respectively an M-axis, a C-axis and an A-axis, when the principal plane is an a-plane. A polarized light having the polarization direction E parallel to the X-axis (namely, the M-axis) is produced from the a-plane nitride semiconductor light-emitting diode.

The X-axis, the Y-axis and the Z-axis are respectively a [−1-120] direction, a [−1101] direction, and a [1-102] direction, when the principal plane has a normal line of a [1-102] direction, namely, when the principal surface is an r-plane. A polarized light having the polarization direction E parallel to the X-axis (namely, the [−1-120] direction) is produced from the r-plane nitride semiconductor light-emitting diode. When the principal plane is a c-plane, a polarized light is not produced.

The nitride semiconductor light-emitting diode 100 has light extraction surface 110b. Preferably, the light extraction surface 110b is flat. This light extraction surface 110b has a normal line parallel to the Z-axis. The polarized light is emitted toward the outside of the nitride semiconductor light-emitting diode 100 through the light extraction surface 110b. The principal plane of the nitride semiconductor light-emitting diode 100 is the light extraction surface 110.

As shown in FIG. 1, both of the first side surface 150a and the second side surface 150b consist only of a plane which includes the Z-axis and the Y-axis. Unlike in the light-emitting diodes disclosed in Japanese Patent Laid-Open Publication No. 2013-038208 and WO 2012/137406, neither the first side surface 150a nor the second side surface 150b has an inclined surface. In other words, the whole plane of the first side surface 150a includes both of the Z-axis and the Y-axis. Similarly, the whole plane of the second side surface 150b includes both of the Z-axis and the Y-axis. As shown in FIG. 1, the first side surface 150a is parallel to the second side surface 150b.

In case where the first side surface 150a or the second side surface 150b has an inclined surface, the light extraction efficiency failed to be improved, as is clear from the comparative examples, which are described later. The polarization degree failed to be improved, too.

As shown in FIG. 1 and FIG. 2, both of the third side surface 152a and the fourth side surface 152b are perpendicular to the first side surface 150a and the second side surface 150b. The third side surface 152a and the fourth side surface 152b include the X-axis.

The third side surface 152a includes an inclined surface 156a. The third side surface 152a may be composed of a perpendicular surface 154a and the inclined surface 156a. The perpendicular surface 154a includes both of the Z-axis and the X-axis. On the other hand, the inclined surface 156a includes the X-axis. However, the inclined surface 156a does not include the Z-axis. As shown in FIG. 2, an angle θ is formed between the inclined surface 156a and the Z-axis.

Similarly, the fourth side surface 152b includes an inclined surface 156b. The fourth side surface 152b may be composed of a perpendicular plane 154b and the inclined surface 156b. The third side surface 152a and the fourth side surface 152b are symmetry with respect to a plane which includes the Z-axis and the X-axis. More particularly, as shown in FIG. 2, the third side surface 152a and the fourth side surface 152b are symmetry with respect to a virtual plane 170 which includes the Z-axis and the X-axis. The virtual plane 170 is located smack in the center of the two perpendicular surfaces 154a and 154b. The angle θ is formed between the inclined surface 156b and the Z-axis.

In the nitride semiconductor light-emitting diode 110 according to the present embodiment, the following mathematical formulae (I), (II), and (III) are satisfied.

$$15 \text{ degrees} \leq \theta \leq 70 \text{ degrees} \quad \text{(I)}$$

$$0.1 \leq (L3 \cos \theta)/h1 \leq 0.5 \quad \text{(II)}$$

$$L2 < L1 \quad \text{(III)}$$

where

θ represents the angle formed between the inclined surface 156a and the Z-axis in the cross-sectional view (see FIG. 2) which includes the Z-axis and the Y-axis, as described above, h1 represents a height of the nitride semiconductor light-emitting diode 110 in the cross-sectional view, as shown in FIG. 2, L1 represents a width of the nitride semiconductor light-emitting diode 110 in the cross-sectional view, as shown in FIG. 2, L2 represents a width of the light extraction surface 110b in the cross-sectional view, as shown in FIG. 2, and L3 represents a length of the inclined surface 156a in the cross-sectional view, as shown in FIG. 2.

As shown in FIG. 2, the perpendicular surface 154a has a height h2 in the cross-sectional view. More particularly, L1 represents a width between the two perpendicular surfaces 154a and 154b in the cross-sectional view, as shown in FIG. 2.

As is clear from the example group A and the comparative example group A, when the angle θ is less than 15 degrees, the light extraction efficiency fails to be improved. The polarization degree fails to be improved, too. Similarly, when the angle θ is more than 70 degrees, the light extraction efficiency fails to be improved. The polarization degree fails to be improved, too. Preferably, the angle θ is not less than 20 degrees and not more than 50 degrees in order to improve the light extraction efficiency and the polarization degree more. More preferably, the angle θ is not less than 28 degrees and not more than 45 degrees in order to improve the light extraction efficiency and the polarization degree furthermore.

As is clear from the example group B and the comparative example group B, when the value of (L3 cos θ) is less than 0.1, the light extraction efficiency fails to be improved. The polarization degree fails to be improved, too. Similarly, when the value of (L3 cos θ) is more than 0.5, the light extraction efficiency fails to be improved. The polarization degree fails to be improved, too. Preferably, the value of (L3 cos θ) is not less than 0.20 and not more than 0.40 in order to improve the light extraction efficiency and the polarization degree more. More preferably, the value of (L3 cos θ) is not less than 0.26 and not more than 0.37 in order to improve the light extraction efficiency and the polarization degree furthermore.

Figure 3:
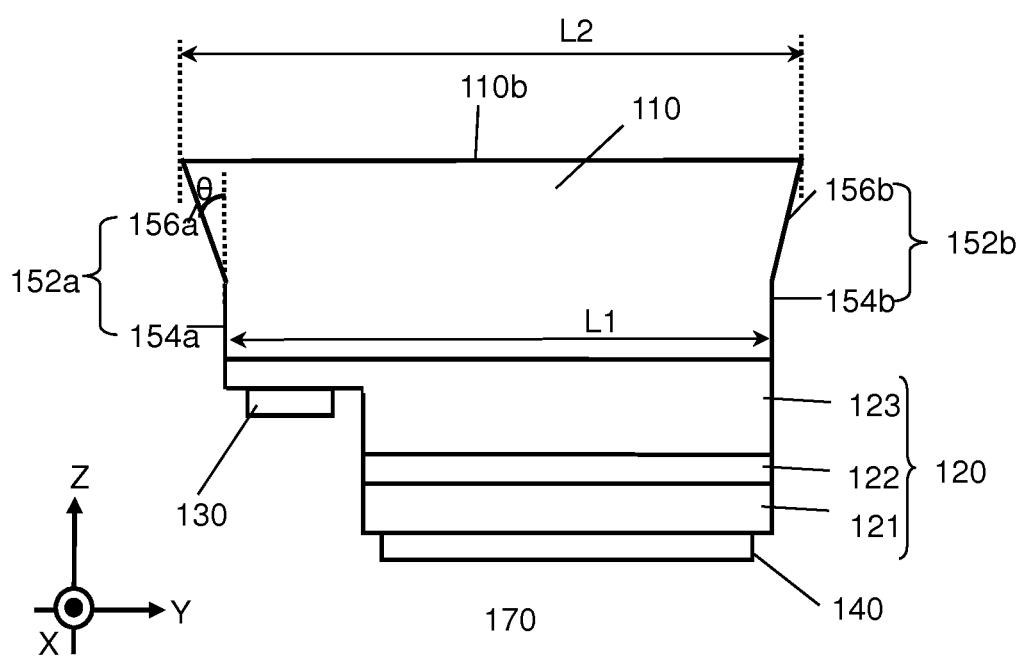
FIG. 3 shows an embodiment where L2 is greater than L1, which is excluded from the present invention.

An embodiment (see FIG. 3) where L2 is greater than L1 is excluded from the present invention.

Preferably, L1 is not less than 300 micrometers and not more than 800 micrometers.

Figure 4:
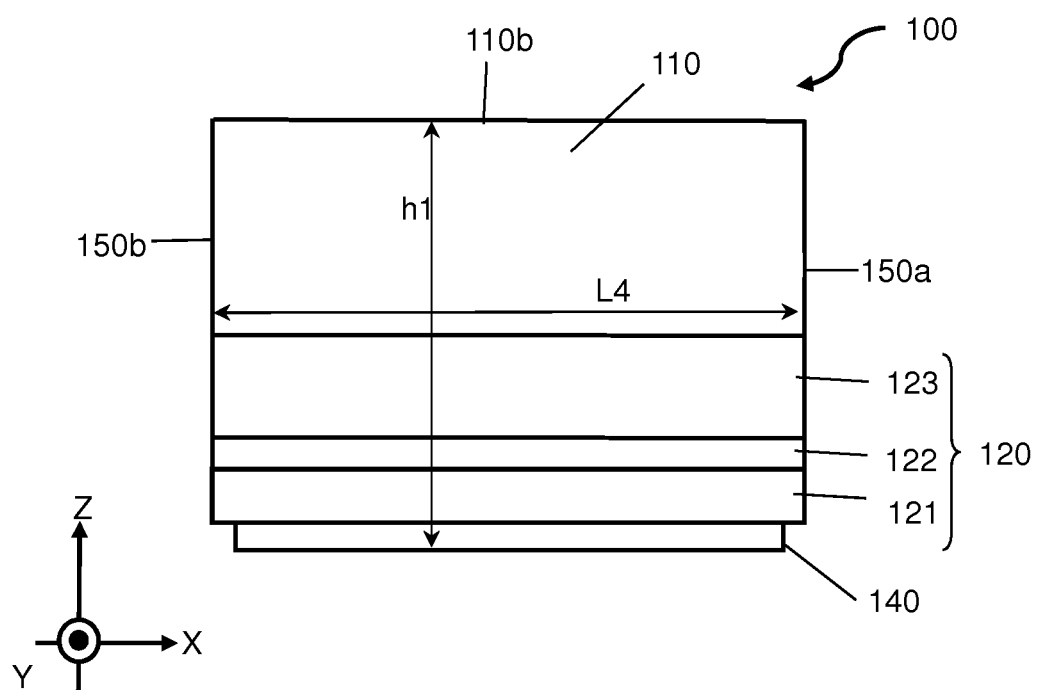
FIG. 4 shows a cross-sectional view of the nitride semiconductor light-emitting diode 100 taken along the plane which includes the Z-axis and the X-axis.

FIG. 4 shows a cross-sectional view of the nitride semiconductor light-emitting diode 100 taken along a plane which includes the Z-axis and the X-axis. L4 represents a distance between the first side surface 150a and the second side surface 150b. Preferably, L4 is equal to L1.

(Fabrication Method)

Next, a method for fabricating the nitride semiconductor light-emitting diode 100 according to the present embodiment is described.

Figure 7A:
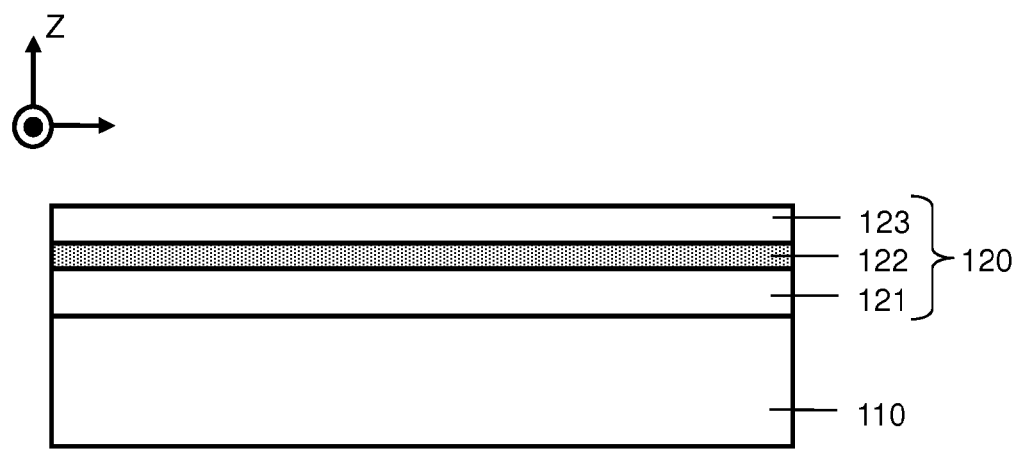
FIG. 7A shows a cross-sectional view of one step included in the fabrication method of the present invention.

Firstly, as shown in FIG. 7A, the nitride semiconductor stacking structure 120 is formed on the obverse surface of the substrate 110. More particularly, the n-type nitride semiconductor layer 121 is epitaxially grown on the obverse surface of the face of substrate 110. Then, the active layer 122 is epitaxially grown on the n-type nitride semiconductor layer 121. The p-type nitride semiconductor layer 123 is epitaxially grown on the active layer 122. In this way, the nitride semiconductor stacking structure 120 is formed on the substrate 110.

Figure 7B:
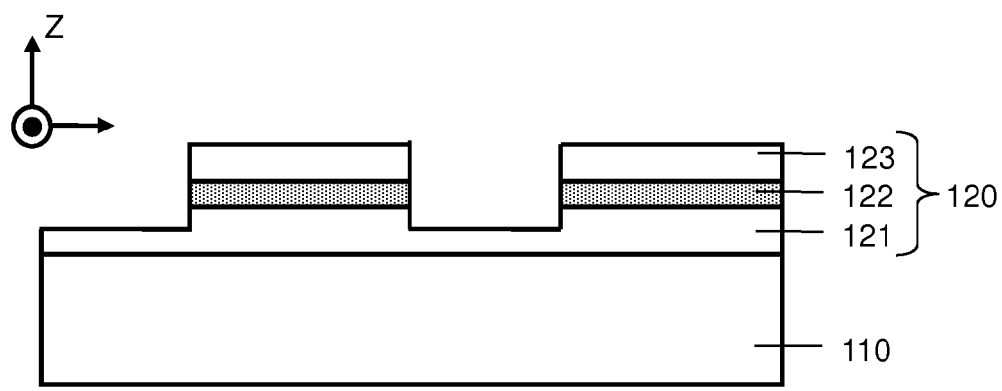
FIG. 7B shows a cross-sectional view of one step included in the fabrication method of the present invention, subsequent to the FIG. 7A.
Figure 7C:
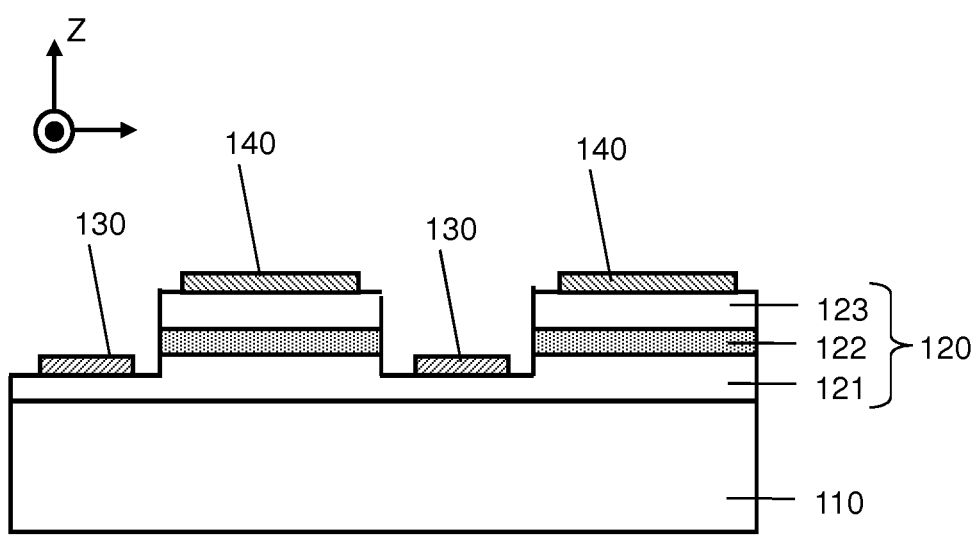
FIG. 7C shows a cross-sectional view of one step included in the fabrication method of the present invention, subsequent to the FIG. 7B.

As shown in FIG. 7B, a part of the nitride semiconductor stacking structure 120 is removed. Subsequently, as shown in FIG. 7C, a plurality of the n-side electrodes 130 and a plurality of the p-side electrodes 140 are formed on the n-type nitride semiconductor layer 121 and the p-type nitride semiconductors 123, respectively. The steps shown in FIG. 7A, FIG. 7B, and FIG. 7C are similar to the steps included in the fabrication method of a conventional nitride semiconductor light-emitting diode 100.

Desirably, a laser fusion method is used in this embodiment. Hereinafter, a laser fusion method used in the present embodiment is described below.

Figure 7D:
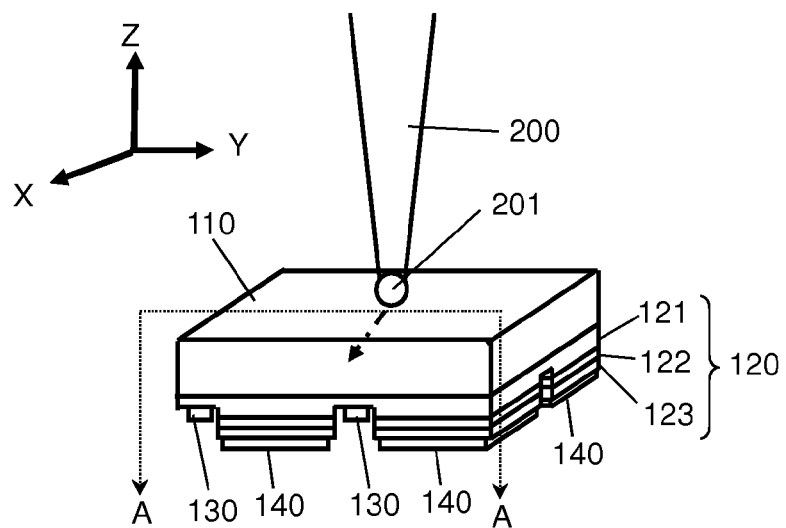
FIG. 7D shows a perspective view of a step where the first groove 160 is formed.

As shown in FIG. 7D, the reverse surface of the substrate 110 is irradiated with a first laser beam 200. This first laser beam 200 has a focus point in the inside or outside of the substrate 110. In other words, the first laser beam 200 does not have a focus point on the reverse surface of the substrate. Accordingly, the first laser beam 200 has a relatively-greater first spot 201 on the reverse surface of the substrate 110. The first spot 201 may be circular.

Figure 7E:
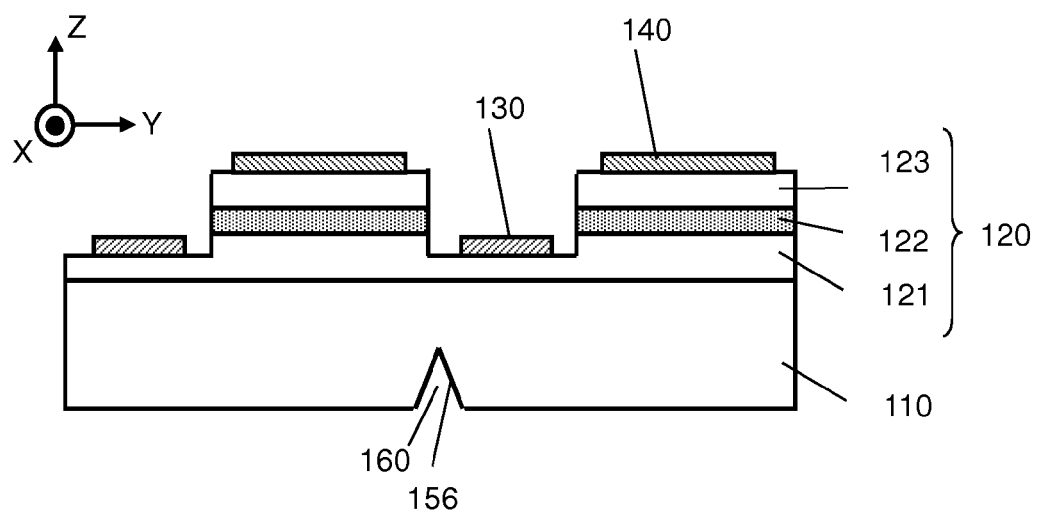
FIG. 7E shows a cross-sectional view taken along the A-A line included in FIG. 7D.

Such a first laser beam 200 is scanned along the X-axis direction. The heat generated by the first laser beam 200 melts the substrate 110. In this way, a first groove 160 is formed on the reverse surface of the substrate 110. The first groove 160 has a shape of a straight line parallel to the X-axis. FIG. 7E shows a cross-sectional view taken along the A-A-line included in FIG. 7D. As shown in FIG. 7E, the first groove 160 has a triangular cross-sectional view. This is because the first laser beam 200 has a relatively-greater first spot 210 on the reverse surface of the substrate 110. In this way, the inclined surface 156 is formed in the first groove 160.

Figure 7F:
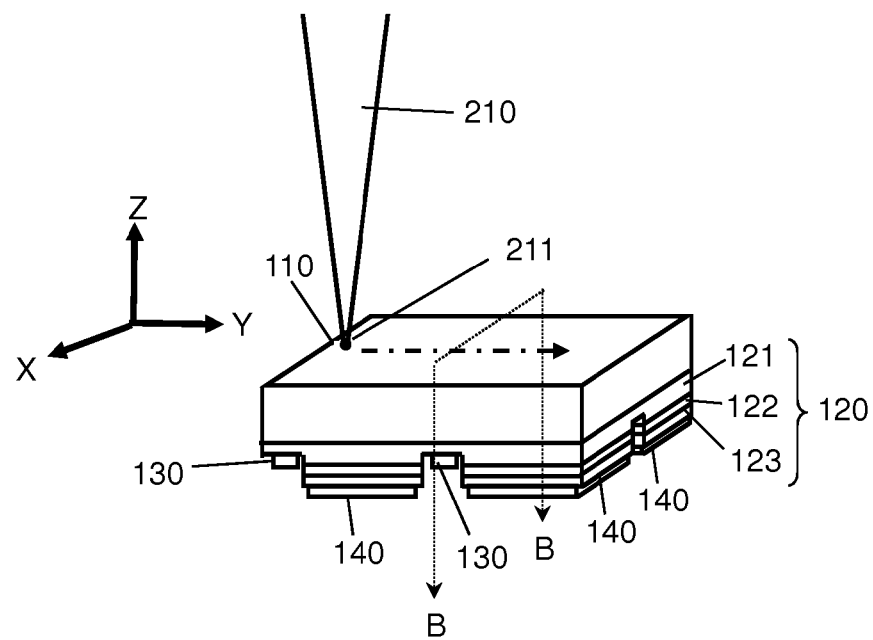
FIG. 7F shows a perspective view of a step where the second groove 161 is formed.

Then, as shown in FIG. 7F, the reverse surface of the substrate 110 is irradiated with a second laser beam 210. This second laser beam 210 has a focus point on the reverse surface of substrate 110. This focus point is a second spot 211. The second spot 211 may be also circular. As is clear from FIG. 7D and FIG. 7F, the second spot 211 is smaller than the first spot 201.

Figure 7G:
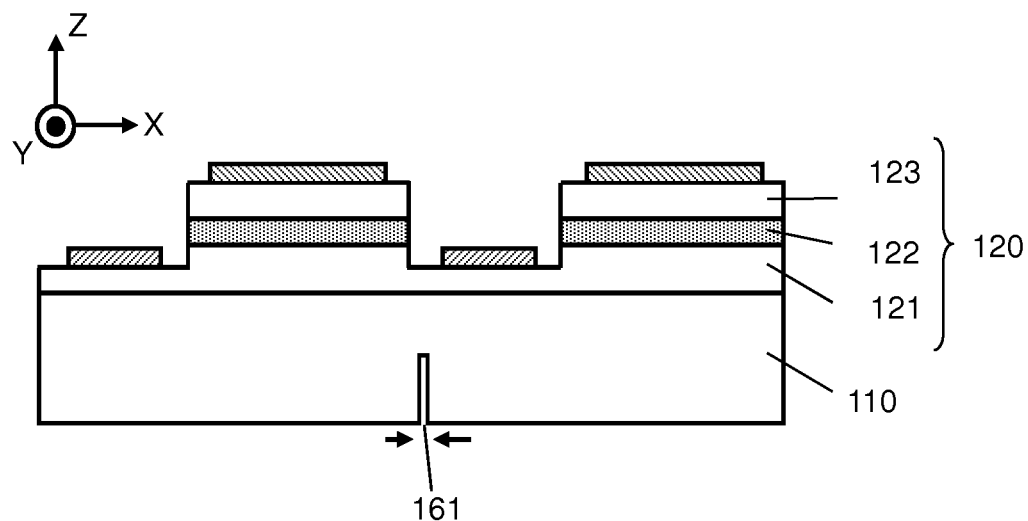
FIG. 7G shows a cross-sectional view taken along the B-B line included in FIG. 7F.

Such a second laser beam 210 is scanned along the Y-axis direction to form a second groove 161 on the reverse surface of the substrate 110. Needless to say, the second groove 161 has a shape of a straight line parallel to the Y-axis. FIG. 7G shows a cross-sectional view taken along the B-B line included in FIG. 7F. Since the second laser beam 210 has a focus point, namely, the second spot 211, on the reverse surface of the substrate 110, the second groove 161 has a rectangular cross-section, as shown in FIG. 7G. In this case, it is obvious that an inclined surface would not be formed, unlike in the case shown in FIG. 7D and FIG. 7E.

Finally, a breaking is performed along the first groove 160 and the second groove 161 to divide into one nitride semiconductor light-emitting diode 100. In this way, the nitride semiconductor light-emitting diode 100 according to the present embodiment is provided.

The step shown in FIG. 7D may be prior to the step shown in FIG. 7F. Alternatively, the step shown in FIG. 7F may be prior to the step shown in FIG. 7D.

Embodiment 2

Then, the embodiment 2 is described.

Figure 8:
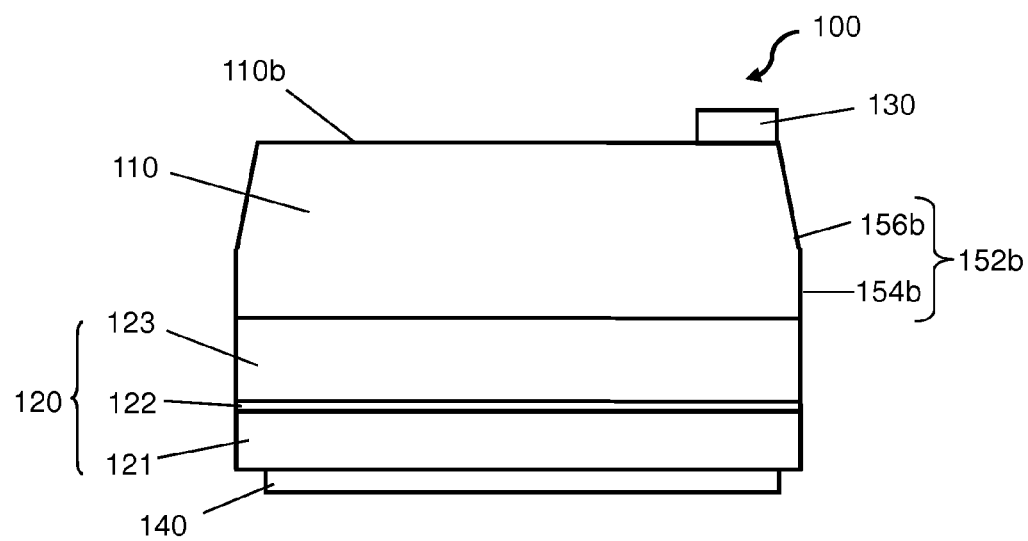
FIG. 8 shows a perspective view of a nitride semiconductor light-emitting diode 100 according to the embodiment 2.

FIG. 8 shows a nitride semiconductor light-emitting diode 100 according to the embodiment 2. Unlike in the nitride semiconductor light-emitting diode according to the embodiment 1, the n-side electrode 130 is formed on the obverse surface of the substrate 110. The substrate 110 is conductive. In the embodiment 2, each element such as the width L1 is the same as one according to the embodiment 1. Similarly to the nitride semiconductor light-emitting diode according to the embodiment 1, the nitride semiconductor light-emitting diode having such a structure also has higher light extraction efficiency and a higher polarization degree.

EXAMPLES

The present invention is described in greater detail with reference to the following examples.

Example Group A

The example group A is composed of an example A1, an example A2 and an example A3. In the example group A, the nitride semiconductor light-emitting diode 100 shown in FIG. 1 was used for a simulation. The X-axis, the Y-axis and the Z-axis are A-axis, C-axis and M axis, respectively.

Example A1

While the angle $\theta$ was varied under a condition described below, an amount of the polarized light incident on the light extraction surface 110b was calculated using a simulator by a ray tracing method.

L1: 800 micrometers
L2: 770 micrometers
L4: 800 micrometers
h1: 100 micrometers
Amount of the light ray: 150,000

Table 1 shows the calculation result.

The values of n1 described in Table 1-Table 18 are calculated by the following mathematical formula (IV).

$n1$=the amount of the polarized light incident on the light extraction surface 110 at the angle $\theta$/the amount of the polarized light incident on the light extraction surface 110 under the condition where angle $\theta$ is equal to zero  (IV)

The light extraction efficiency is increased with an increase in the value of n1.

TABLE 1

| $\theta$ | Amount of the polarized light incident on the light extraction surface 110b | n1 | Polarization degree |
|---|---|---|---|
| 0 | 31205 | 1 | 0.681802 |
| 5 | 31205 | 1 | 0.681802 |
| 10 | 31521 | 1.010127 | 0.684489 |
| 15 | 31995 | 1.025316 | 0.688435 |
| 18 | 32153 | 1.03038 | 0.689729 |
| 20 | 32785 | 1.050633 | 0.694797 |
| 28 | 33101 | 1.060759 | 0.69727 |
| 32 | 33180 | 1.063291 | 0.697881 |
| 37 | 33180 | 1.063291 | 0.697881 |
| 45 | 33101 | 1.060759 | 0.69727 |
| 50 | 32785 | 1.050633 | 0.694797 |
| 60 | 32469 | 1.040506 | 0.692284 |
| 70 | 32704 | 1.027848 | 0.689083 |
| 80 | 31521 | 1.010127 | 0.684489 |
| 85 | 31205 | 1 | 0.681802 |

Example A2

The calculation similar to that of the example A1 was conducted, except that L1=L4=450 micrometers, L2=420 micrometers, and that an amount of the light ray was 100,000. Table 2 shows the results.

TABLE 2

| θ | Amount of the polarized light incident on the light extraction surface 110b | n1 | Polarization degree |
|---|---|---|---|
| 0 | 9680 | 1 | 0.68187 |
| 5 | 9680 | 1 | 0.68187 |
| 10 | 9856 | 1.018182 | 0.68666 |
| 15 | 10120 | 1.045455 | 0.693582 |
| 18 | 10208 | 1.054545 | 0.695822 |
| 22 | 10472 | 1.081818 | 0.702349 |
| 28 | 10736 | 1.109091 | 0.708602 |
| 32 | 10780 | 1.113636 | 0.709619 |
| 37 | 10780 | 1.113636 | 0.709619 |
| 45 | 10736 | 1.109091 | 0.708602 |
| 50 | 10619 | 1.097004 | 0.705863 |
| 60 | 10384 | 1.072727 | 0.700205 |
| 70 | 10164 | 1.05 | 0.694706 |
| 80 | 9856 | 1.018182 | 0.68666 |
| 85 | 9680 | 1 | 0.68187 |

Example A3

The calculation similar to that of the example A1 was conducted, except that L1=L4=300 micrometers, L2=270 micrometers and that an amount of the light ray was 50,000. Table 3 shows the results.

TABLE 3

| θ | Amount of the polarized light incident on the light extraction surface 110b | n1 | Polarization degree |
|---|---|---|---|
| 0 | 4205 | 1 | 0.681664 |
| 5 | 4205 | 1 | 0.681664 |
| 10 | 4321 | 1.027586 | 0.68888 |
| 15 | 4495 | 1.068966 | 0.699112 |
| 18 | 4553 | 1.082759 | 0.702374 |
| 20 | 4727 | 1.124138 | 0.711751 |
| 28 | 4901 | 1.165517 | 0.720555 |
| 32 | 4930 | 1.172414 | 0.72197 |
| 37 | 4930 | 1.172414 | 0.72197 |
| 45 | 4901 | 1.165517 | 0.720555 |
| 50 | 4785 | 1.137931 | 0.714746 |
| 60 | 4669 | 1.110345 | 0.708692 |
| 70 | 4524 | 1.075862 | 0.700752 |
| 80 | 4321 | 1.027586 | 0.68888 |
| 85 | 4205 | 1 | 0.681664 |

As is clear from TABLES 1-3, when the angle θ is not less than 15 degrees and not more than 70 degrees, the values of n1 are not less than 1.02. Thus, the light extraction efficiency is improved. When the angle θ is not less than 20 degrees and not more than 50 degrees, the values of n1 are not less than 1.05 and the light extraction efficiency is improved more. When the angle θ is not less than 28 degrees and not more than 45 degrees, the values of n1 are not less than 1.06 and the light extraction efficiency is improved furthermore.

Comparative Example Group A

The comparative example group A is comprised of a comparative example A1, a comparative example A2, a comparative example A3, a comparative example A4, a comparative example A5 and a comparative example A6.

Figure 5:
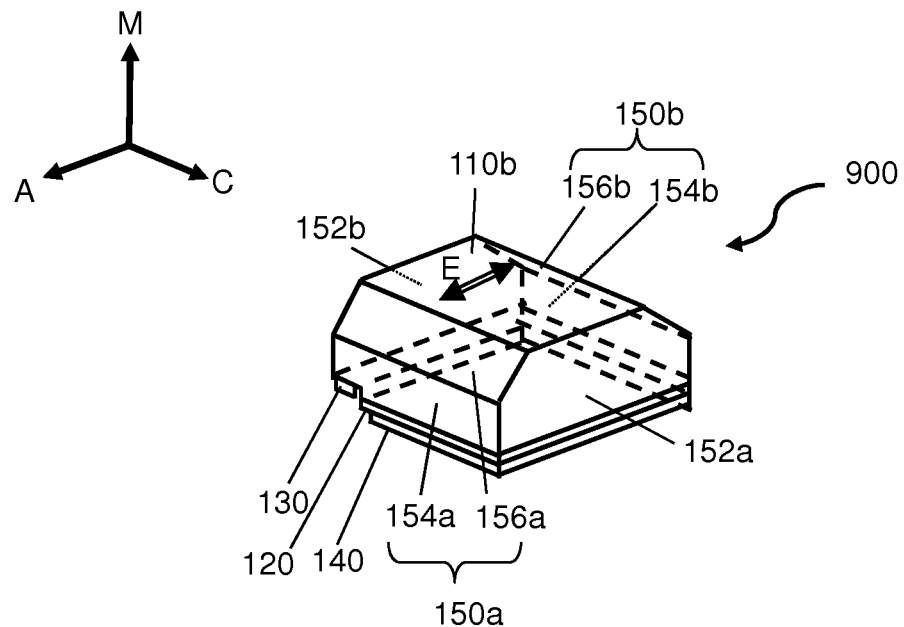
FIG. 5 shows a perspective view of a nitride semiconductor light-emitting diode 900 used in the comparative examples A1-A3, B1-B3, and C4.

In the comparative examples A1-A3, the nitride semiconductor light-emitting diode 900 shown in FIG. 5 was used for the simulation. See FIG. 5 (c-2) included in WO 2012/137406.

Unlike the nitride semiconductor light-emitting diode 100 shown in FIG. 1, the first side surface 150a and the second side surface 150b have inclined surface in the nitride semiconductor light-emitting diode 900 shown in FIG. 5. However, the third side surface 152a and the fourth side surface 152b do not have an inclined surface. Since the nitride semiconductor light-emitting diode 900 shown in FIG. 5 is an m-plane nitride semiconductor light-emitting diode 100, the polarized light is parallel to the A-axis.

Figure 6:
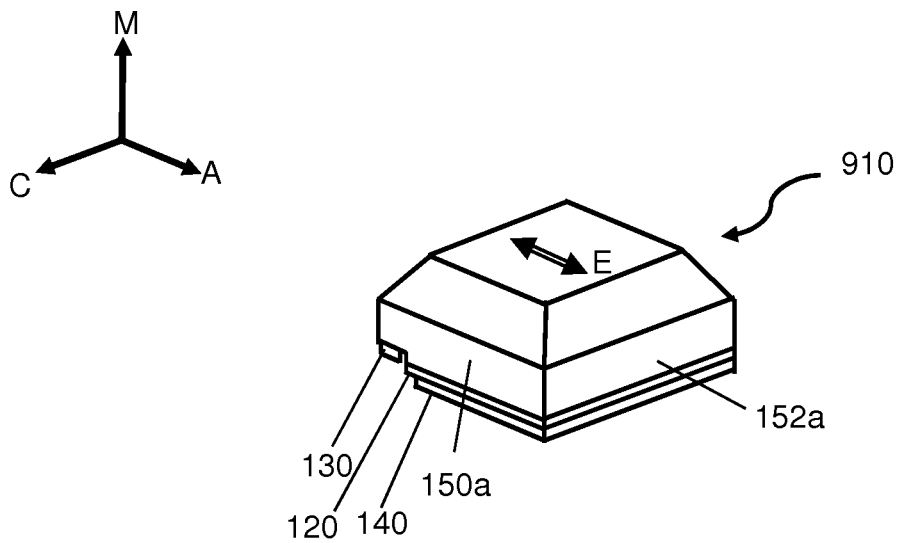
FIG. 6 shows a perspective view of a nitride semiconductor light-emitting diode 910 used in the comparative examples A4-A6, B4-B6, and C1-C3.

In the comparative examples A4-A6, the nitride semiconductor light-emitting diode 910 shown in FIG. 6 was used for the simulation. See Japanese Patent Laid-Open Publication No. 2013-038208.

Unlike the nitride semiconductor light-emitting diode 100 shown in FIG. 1, the first side surface 150a and the second side surface (not shown in FIG. 6) have inclined surfaces in the nitride semiconductor light-emitting diode 910 shown in FIG. 6. Furthermore, the third side surface 152a and the fourth side surface (not shown in FIG. 6) also have inclined surfaces. Since the nitride semiconductor light-emitting diode 910 shown in FIG. 6 is also an m-plane nitride semiconductor light-emitting diode 100, the polarized light is parallel to the A-axis.

Comparative Example A1

The calculation similar to that of the example A1 was conducted, except that the nitride semiconductor light-emitting diode 900 shown in FIG. 5 was used instead of the nitride semiconductor light-emitting diode 100 shown in FIG. 1. TABLE 4 shows the results.

TABLE 4

| θ | Amount of the polarized light incident on the light extraction surface 110b | n1 | Polarization degree |
|---|---|---|---|
| 0 | 31205 | 1 | 0.681802 |
| 5 | 31205 | 1 | 0.681802 |
| 10 | 31260 | 1.001763 | 0.682273 |
| 15 | 31343 | 1.004422 | 0.682981 |
| 18 | 31371 | 1.00532 | 0.683219 |
| 20 | 31482 | 1.008877 | 0.68416 |
| 28 | 31537 | 1.010639 | 0.684624 |
| 32 | 31551 | 1.011088 | 0.684742 |
| 37 | 31551 | 1.011088 | 0.684742 |
| 45 | 31537 | 1.010639 | 0.684624 |
| 50 | 31482 | 1.008877 | 0.68416 |
| 60 | 31426 | 1.007082 | 0.683686 |
| 70 | 31357 | 1.004871 | 0.6831 |
| 80 | 31260 | 1.001763 | 0.682273 |
| 85 | 31205 | 1 | 0.681802 |

Comparative Example A2

The calculation similar to that of the comparative example A1 was conducted, except that L1=L4=450 micrometers, L2=420 micrometers, and that an amount of the light ray was 100,000. TABLE 5 shows the results.

TABLE 5

| θ | Amount of the polarized light incident on the light extraction surface 110b | n1 | Polarization degree |
|---|---|---|---|
| 0 | 9680 | 1 | 0.68187 |
| 5 | 9680 | 1 | 0.68187 |
| 10 | 9711 | 1.003202 | 0.682724 |
| 15 | 9757 | 1.007955 | 0.683983 |
| 18 | 9772 | 1.009504 | 0.684392 |
| 22 | 9819 | 1.01436 | 0.685665 |
| 28 | 9865 | 1.019112 | 0.686902 |
| 32 | 9873 | 1.019938 | 0.687116 |
| 37 | 9873 | 1.019938 | 0.687116 |
| 45 | 9865 | 1.019112 | 0.686902 |
| 50 | 9844 | 1.016942 | 0.686338 |
| 60 | 9803 | 1.012707 | 0.685233 |
| 70 | 9765 | 1.008781 | 0.684201 |
| 80 | 9711 | 1.003202 | 0.682724 |
| 85 | 9680 | 1 | 0.68187 |

Comparative Example A3

The calculation similar to that of the comparative example A1 was conducted, except that L1=L4=300 micrometers, L2=270 micrometers, and that the amount of the light ray was 50,000. TABLE 6 shows the results.

TABLE 6

| θ | Amount of the polarized light incident on the light extraction surface 110b | n1 | Polarization degree |
|---|---|---|---|
| 0 | 4205 | 1 | 0.681664 |
| 5 | 4205 | 1 | 0.681664 |
| 10 | 4225 | 1.004756 | 0.682932 |
| 15 | 4256 | 1.012128 | 0.684877 |
| 18 | 4266 | 1.014507 | 0.6855 |
| 20 | 4296 | 1.021641 | 0.687353 |
| 28 | 4327 | 1.029013 | 0.689245 |
| 32 | 4332 | 1.030202 | 0.689548 |
| 37 | 4332 | 1.030202 | 0.689548 |
| 45 | 4327 | 1.029013 | 0.689245 |
| 50 | 4307 | 1.024257 | 0.688027 |
| 60 | 4286 | 1.019263 | 0.686738 |
| 70 | 4261 | 1.013317 | 0.685189 |
| 80 | 4225 | 1.004756 | 0.682932 |
| 85 | 4205 | 1 | 0.681664 |

As is clear from the comparison of TABLES 4-6 to TABLES 1-3, the nitride semiconductor light-emitting diode 100 according to the embodiment A has a higher light extraction efficiency and a higher polarization degree than the nitride semiconductor light-emitting diode 900 shown in FIG. 5. In other words, the light extraction efficiency and the polarization degrees fail to be improved in the case where the first side surface 150a and the second side surface 150b have inclined surfaces and where the third side 152a and the fourth side 152b do not have an inclined surface.

Comparative Example A4

The calculation similar to that of the example A1 was conducted, except that the nitride semiconductor light-emitting diode 910 shown in FIG. 6 was used instead of the nitride semiconductor light-emitting diode 100 shown in FIG. 1. TABLE 7 shows the results.

TABLE 7

| θ | Amount of the polarized light incident on the light extraction surface 110b | n1 | Polarization degree |
|---|---|---|---|
| 0 | 31205 | 1 | 0.681802 |
| 5 | 30810 | 0.987342 | 0.678379 |
| 10 | 30340 | 0.97228 | 0.674208 |
| 15 | 30819 | 0.98763 | 0.678458 |
| 18 | 30979 | 0.992758 | 0.679853 |
| 20 | 31618 | 1.013235 | 0.685305 |
| 28 | 31938 | 1.02349 | 0.687966 |
| 32 | 32018 | 1.026054 | 0.688624 |
| 37 | 32018 | 1.026054 | 0.688624 |
| 45 | 31938 | 1.02349 | 0.687966 |
| 50 | 31618 | 1.013235 | 0.685305 |
| 60 | 31299 | 1.003012 | 0.682606 |
| 70 | 30899 | 0.990194 | 0.679157 |
| 80 | 30340 | 0.97228 | 0.674208 |
| 85 | 30020 | 0.962025 | 0.671306 |

Comparative Example A5

The calculation similar to that of the comparative example A4 was conducted, except that L1=L4=450 micrometers, L2=420 micrometers, and that an amount of the light ray was 100.000. TABLE 8 shows the results.

TABLE 8

| θ | Amount of the polarized light incident on the light extraction surface 110b | n1 | Polarization degree |
|---|---|---|---|
| 0 | 9680 | 1 | 0.68187 |
| 5 | 9460 | 0.977273 | 0.675671 |
| 10 | 9198 | 0.950207 | 0.667966 |
| 15 | 9465 | 0.977789 | 0.675814 |
| 18 | 9554 | 0.986983 | 0.678349 |
| 22 | 9821 | 1.014566 | 0.685719 |
| 28 | 10088 | 1.042149 | 0.692759 |
| 32 | 10133 | 1.046798 | 0.693915 |
| 37 | 10133 | 1.046798 | 0.693915 |
| 45 | 10088 | 1.042149 | 0.692759 |
| 50 | 9970 | 1.029959 | 0.689687 |
| 60 | 9732 | 1.005372 | 0.6833 |
| 70 | 9510 | 0.982438 | 0.677101 |
| 80 | 9198 | 0.950207 | 0.667966 |
| 85 | 9020 | 0.931818 | 0.66252 |

Comparative Example A6

The calculation similar to that of the comparative example A4 was conducted, except that L1=L4=300 micrometers, L2=270 micrometers, and an amount of the light ray was 50,000. TABLE 9 shows the results.

TABLE 9

| θ | Amount of the polarized light incident on the light extraction surface 110b | n1 | Polarization degree |
|---|---|---|---|
| 0 | 4205 | 1 | 0.681664 |
| 5 | 4060 | 0.965517 | 0.672158 |
| 10 | 3887 | 0.924376 | 0.660047 |
| 15 | 4063 | 0.966231 | 0.672361 |

TABLE 9-continued

| θ | Amount of the polarized light incident on the light extraction surface 110b | n1 | Polarization degree |
|---|---|---|---|
| 18 | 4122 | 0.980262 | 0.676291 |
| 20 | 4298 | 1.022117 | 0.687475 |
| 28 | 4474 | 1.063971 | 0.697913 |
| 32 | 4503 | 1.070868 | 0.699566 |
| 37 | 4503 | 1.070868 | 0.699566 |
| 45 | 4474 | 1.063971 | 0.697913 |
| 50 | 4356 | 1.03591 | 0.690994 |
| 60 | 4239 | 1.008086 | 0.683813 |
| 70 | 4093 | 0.973365 | 0.674371 |
| 80 | 3887 | 0.924376 | 0.660047 |
| 80 | 3770 | 0.896552 | 0.651336 |

As is clear from the comparison of TABLES 7-9 to TABLES 1-3, the nitride semiconductor light-emitting diode 100 according to the example group A has higher light extraction efficiency and a higher polarization degree than the nitride semiconductor light-emitting diode 910 shown in FIG. 6. In other words, the light extraction efficiency and the polarization degrees fail to be improved in the case where all of the first side surface 150a, the second side surface 150b, the third side surface 152a, and the fourth side surface 152b have inclined surfaces.

Example Group B

The example group B is composed of an example B1, an example B2 and an example B3. In the example group B, the nitride semiconductor light-emitting diode 100 shown in FIG. 1 was used for a simulation. The X-axis, the Y-axis and the Z-axis are A-axis, C-axis and Maxis, respectively.

Example B1

While the value of (L3 cos θ) was varied under a condition described below, an amount of the polarized light incident on the light extraction surface 110 was calculated using a simulator by a ray tracing method.
L1: 800 micrometers
L4: 800 micrometers
θ: 30 degrees
h1: 100 micrometers
Amount of the light ray: 150,000
Table 10 shows the calculation result.

TABLE 10

| Value of L3cosθ | Amount of the polarized light incident on the light extraction surface 110b | n1 | Polarization degree |
|---|---|---|---|
| 0 | 31205 | 1 | 0.681802 |
| 0.05 | 31554 | 1.011184 | 0.684767 |
| 0.1 | 31902 | 1.022336 | 0.687669 |
| 0.13 | 32135 | 1.029803 | 0.689582 |
| 0.18 | 32367 | 1.037238 | 0.691464 |
| 0.2 | 32599 | 1.044672 | 0.693323 |
| 0.26 | 32948 | 1.055856 | 0.696077 |
| 0.28 | 33064 | 1.059574 | 0.696982 |
| 0.32 | 33180 | 1.063291 | 0.697881 |
| 0.34 | 33064 | 1.059574 | 0.696982 |
| 0.37 | 32948 | 1.055856 | 0.696077 |
| 0.4 | 32599 | 1.044672 | 0.693323 |
| 0.5 | 31902 | 1.022336 | 0.687669 |
| 0.55 | 31205 | 1 | 0.681802 |
| 0.7 | 31205 | 1 | 0.681802 |
| 0.9 | 31205 | 1 | 0.681802 |

Example B2

The calculation similar to that of the example B1 was conducted, except that L1=L4=450 and that an amount of the light ray was 100,000. TABLE 11 shows the results.

TABLE 11

| Value of L3cosθ | Amount of the polarized light incident on the light extraction surface 110b | n1 | Polarization degree |
|---|---|---|---|
| 0 | 9680 | 1 | 0.68187 |
| 0.02 | 9680 | 1 | 0.68187 |
| 0.05 | 9680 | 1 | 0.68187 |
| 0.1 | 10321 | 1.066219 | 0.69865 |
| 0.2 | 10855 | 1.121384 | 0.711335 |
| 0.24 | 11282 | 1.165496 | 0.720735 |
| 0.25 | 11442 | 1.182025 | 0.724102 |
| 0.28 | 11507 | 1.18874 | 0.725446 |
| 0.32 | 11389 | 1.17655 | 0.722995 |
| 0.35 | 11282 | 1.165496 | 0.720735 |
| 0.4 | 10962 | 1.132438 | 0.71375 |
| 0.5 | 10321 | 1.066219 | 0.69865 |
| 0.6 | 9680 | 1 | 0.68187 |
| 0.7 | 9680 | 1 | 0.68187 |
| 0.9 | 9680 | 1 | 0.68187 |

Example B3

The calculation similar to that of the example B1 was conducted, except that L1=L4=300 micrometers and that an amount of the light ray was 50,000. TABLE 12 shows the results.

TABLE 12

| Value of L3cosθ | Amount of the polarized light incident on the light extraction surface 110b | n1 | Polarization degree |
|---|---|---|---|
| 0 | 4205 | 1 | 0.681664 |
| 0.05 | 4321 | 1.027586 | 0.68888 |
| 0.1 | 4437 | 1.055172 | 0.695777 |
| 0.13 | 4669 | 1.110345 | 0.708692 |
| 0.17 | 4824 | 1.147206 | 0.716726 |
| 0.25 | 4901 | 1.165517 | 0.720555 |
| 0.31 | 4940 | 1.174791 | 0.720555 |
| 0.34 | 4901 | 1.165517 | 0.722455 |
| 0.37 | 4785 | 1.137931 | 0.720555 |
| 0.4 | 4669 | 1.110345 | 0.714746 |
| 0.5 | 4437 | 1.055172 | 0.708692 |
| 0.55 | 4205 | 1 | 0.695777 |
| 0.7 | 4205 | 1 | 0.681664 |
| 0.9 | 4205 | 1 | 0.681664 |

As is clear from TABLES 10-12, if the value of L3 cos θ is not less than 0.1 and not more than 0.5, the value of n1 is not less than 1.02. Thus, the light extraction efficiency is improved. If the value of L3 cos θ is not less than 0.20 and not more than 0.40, the value of n1 is not less than 1.04, and the light extraction efficiency is improved more. If the value of L3 cos θ is not less than 0.26 and not more than 0.37, the value of n1 is not less than 1.05, and the light extraction efficiency is improved furthermore.

Comparative Example Group B

The comparative example group B is composed a comparative example B1, a comparative example B2, a comparative example B3, a comparative example B4, a comparative example B5 and a comparative example B6.

Similarly to the case of the comparative examples A1-A3, the nitride semiconductor light-emitting diode 900 shown in FIG. 5 was used for the simulation in the comparative example B1-B3.

Similarly to the comparative examples A4-A6, the nitride semiconductor light-emitting diode 910 shown in FIG. 6 was used for the simulation in the comparative examples B4-B6.

Comparative Example B1

The calculation similar to that of the example B1 was conducted, except that the nitride semiconductor light-emitting diode 900 shown in FIG. 5 was used instead of the nitride semiconductor light-emitting diode 100 shown in FIG. 1. TABLE 13 shows the results.

TABLE 13

| Value of L3cosθ | Amount of the polarized light incident on the light extraction surface 110b | n1 | Polarization degree |
|---|---|---|---|
| 0 | 31205 | 1 | 0.681802 |
| 0.05 | 31266 | 1.001955 | 0.682324 |
| 0.1 | 31327 | 1.00391 | 0.682845 |
| 0.13 | 31368 | 1.005224 | 0.683194 |
| 0.18 | 31408 | 1.006505 | 0.683533 |
| 0.2 | 31449 | 1.007819 | 0.683881 |
| 0.26 | 31510 | 1.009774 | 0.684396 |
| 0.28 | 31530 | 1.010415 | 0.684565 |
| 0.32 | 31551 | 1.011088 | 0.684742 |
| 0.34 | 31530 | 1.010415 | 0.684565 |
| 0.37 | 31510 | 1.009774 | 0.684396 |
| 0.4 | 31449 | 1.007819 | 0.683881 |
| 0.5 | 31327 | 1.00391 | 0.682845 |
| 0.55 | 31205 | 1 | 0.681802 |
| 0.7 | 31205 | 1 | 0.681802 |
| 0.9 | 31205 | 1 | 0.681802 |

Comparative Example B2

The calculation similar to that of the comparative example B1 was conducted, except that L1=L4=450 micrometers and that an amount of the light ray was 100,000. TABLE 14 shows the results.

TABLE 14

| Value of L3cosθ | Amount of the polarized light incident on the light extraction surface 110b | n1 | Polarization degree |
|---|---|---|---|
| 0 | 9680 | 1 | 0.68187 |
| 0.02 | 9680 | 1 | 0.68187 |
| 0.05 | 9680 | 1 | 0.68187 |
| 0.1 | 9792 | 1.01157 | 0.684935 |
| 0.2 | 9886 | 1.021281 | 0.687463 |
| 0.24 | 9960 | 1.028926 | 0.689424 |
| 0.25 | 9988 | 1.031818 | 0.69016 |
| 0.28 | 10000 | 1.033058 | 0.690474 |
| 0.32 | 9979 | 1.030888 | 0.689924 |
| 0.35 | 9960 | 1.028926 | 0.689424 |

TABLE 14-continued

| Value of L3cosθ | Amount of the polarized light incident on the light extraction surface 110b | n1 | Polarization degree |
|---|---|---|---|
| 0.4 | 9904 | 1.02314 | 0.687942 |
| 0.5 | 9792 | 1.01157 | 0.684935 |
| 0.6 | 9680 | 1 | 0.68187 |
| 0.7 | 9680 | 1 | 0.68187 |
| 0.9 | 9680 | 1 | 0.68187 |

Comparative Example B3

The calculation similar to that of the comparative example B1 was conducted, except that L1=L4=300 micrometers and that an amount of the light ray was 50,000. TABLE 15 shows the results.

TABLE 15

| Value of L3cosθ | Amount of the polarized light incident on the light extraction surface 110b | n1 | Polarization degree |
|---|---|---|---|
| 0 | 4205 | 1 | 0.681664 |
| 0.05 | 4225 | 1.004756 | 0.682932 |
| 0.1 | 4246 | 1.00975 | 0.684252 |
| 0.13 | 4286 | 1.019263 | 0.686738 |
| 0.17 | 4313 | 1.025684 | 0.688393 |
| 0.25 | 4327 | 1.029013 | 0.689245 |
| 0.25 | 4327 | 1.029013 | 0.689245 |
| 0.31 | 4334 | 1.030678 | 0.689669 |
| 0.34 | 4327 | 1.029013 | 0.689245 |
| 0.37 | 4307 | 1.024257 | 0.688027 |
| 0.4 | 4286 | 1.019263 | 0.686738 |
| 0.5 | 4246 | 1.00975 | 0.684252 |
| 0.55 | 4205 | 1 | 0.681664 |
| 0.7 | 4205 | 1 | 0.681664 |
| 0.9 | 4205 | 1 | 0.681664 |

As is clear from the comparison of TABLES 13-15 to TABLES 10-12, the nitride semiconductor light-emitting diode 100 according to the embodiment A has a higher light extraction efficiency and a higher polarization degree than the nitride semiconductor light-emitting diode 900 shown in FIG. 5. In other words, the light extraction efficiency and the polarization degrees fail to be improved in the case where the first side surface 150a and the second side surface 150b have inclined surfaces and where the third side 152a and the fourth side surface 152b do not have an inclined surface.

Comparative Example B4

The calculation similar to that of the example B1 was conducted, except that the nitride semiconductor light-emitting diode 910 shown in FIG. 6 was used instead of the nitride semiconductor light-emitting diode 100 shown in FIG. 1. TABLE 16 shows the results.

TABLE 16

| Value of L3cosθ | Amount of the polarized light incident on the light extraction surface 110b | n1 | Polarization degree |
|---|---|---|---|
| 0 | 31205 | 0.681802 | 0.681802 |
| 0.05 | 31155 | 0.681373 | 0.681373 |
| 0.1 | 30725 | 0.677632 | 0.677632 |
| 0.13 | 30961 | 0.679696 | 0.679696 |
| 0.18 | 31196 | 0.681725 | 0.681725 |
| 0.2 | 31430 | 0.68372 | 0.68372 |

TABLE 16-continued

| Value of L3cosθ | Amount of the polarized light incident on the light extraction surface 110b | n1 | Polarization degree |
|---|---|---|---|
| 0.26 | 31783 | 0.686682 | 0.686682 |
| 0.28 | 31901 | 0.68766 | 0.68766 |
| 0.32 | 32018 | 0.688624 | 0.688624 |
| 0.34 | 31901 | 0.68766 | 0.68766 |
| 0.37 | 31783 | 0.686682 | 0.686682 |
| 0.4 | 31430 | 0.68372 | 0.68372 |
| 0.5 | 30725 | 0.677632 | 0.677632 |
| 0.55 | 30020 | 0.671306 | 0.671306 |
| 0.7 | 30020 | 0.671306 | 0.671306 |
| 0.9 | 30020 | 0.671306 | 0.671306 |

Comparative Example B5

The calculation similar to that of the comparative example B4 was conducted, except that L1=L4=450 micrometers and that an amount of the light ray was 100,000. TABLE 17 shows the results.

TABLE 17

| Value of L3cosθ | Amount of the polarized light incident on the light extraction surface 110b | n1 | Polarization degree |
|---|---|---|---|
| 0 | 9680 | 0.68187 | 0.68187 |
| 0.02 | 9460 | 0.675671 | 0.675671 |
| 0.05 | 9020 | 0.66252 | 0.66252 |
| 0.1 | 9668 | 0.681538 | 0.681538 |
| 0.2 | 10208 | 0.695822 | 0.695822 |
| 0.24 | 10640 | 0.706359 | 0.706359 |
| 0.25 | 10802 | 0.710124 | 0.710124 |
| 0.28 | 10867 | 0.711608 | 0.711608 |
| 0.32 | 10748 | 0.70888 | 0.70888 |
| 0.35 | 10640 | 0.706359 | 0.706359 |
| 0.4 | 10316 | 0.698526 | 0.698526 |
| 0.5 | 9668 | 0.681538 | 0.681538 |
| 0.6 | 9020 | 0.66252 | 0.66252 |
| 0.7 | 9020 | 0.66252 | 0.66252 |
| 0.9 | 9020 | 0.66252 | 0.66252 |

Comparative Example B6

The calculation similar to that of the comparative example B4 was conducted, except that L1=L4=300 micrometers and that an amount of the light ray was 50,000. TABLE 18 shows the results.

TABLE 18

| Value of L3cosθ | Amount of the polarized light incident on the light extraction surface 110b | n1 | Polarization degree |
|---|---|---|---|
| 0 | 4205 | 0.681664 | 0.681664 |
| 0.05 | 4172 | 0.679549 | 0.679549 |
| 0.1 | 4005 | 0.668402 | 0.668402 |
| 0.13 | 4239 | 0.683813 | 0.683813 |
| 0.17 | 4396 | 0.693374 | 0.693374 |
| 0.25 | 4474 | 0.697913 | 0.697913 |
| 0.25 | 4474 | 0.697913 | 0.697913 |
| 0.31 | 4513 | 0.700132 | 0.700132 |
| 0.34 | 4474 | 0.697913 | 0.697913 |
| 0.37 | 4356 | 0.690994 | 0.690994 |
| 0.4 | 4239 | 0.683813 | 0.683813 |
| 0.5 | 4005 | 0.668402 | 0.668402 |
| 0.55 | 3770 | 0.651336 | 0.651336 |
| 0.7 | 3770 | 0.651336 | 0.651336 |
| 0.9 | 3770 | 0.651336 | 0.651336 |

As is clear from the comparison of TABLES 16-18 to TABLES 10-12, the nitride semiconductor light-emitting diode 100 according to the example group B has higher light extraction efficiency and a higher polarization degree than the nitride semiconductor light-emitting diode 910 shown in FIG. 6. In other words, the light extraction efficiency and the polarization degrees fail to be improved in the case where all of the first side surface 150a, the second side surface 150b, the third side 152a and the fourth side 152b have the inclined surfaces.

Example Group C

The present invention is described below in more detail with reference to the example group C.

The Example group C is composed of an example C1, an example C2 and an example C3. The comparative example group C is composed of a comparative example C1, a comparative example C2, a comparative example C3, a comparative example C4 and a comparative example C5.

A metalorganic chemical vapor deposition method (hereinafter, referred to as "MOCVD") was employed as an epitaxial growth method in the example group C and the comparative example group C.

Table 19 shows the material employed in the example group C and the comparative example group C.

TABLE 19

| Al material | Trimethyl aluminum (TMA) |
| In material | Trimethyl indium (TMI) |
| Ga material | Trimethyl gallium (TMG) |
| Nitrogen material | Ammonia |
| n-type impurities | Monosilane |
| p-type impurities | Cyclopentadienyl magnesium ($Cp_2Mg$) |

Example C1

Firstly, an n-type GaN substrate 110 having a principal plane of an m-plane was prepared. The n-type GaN substrate 110 had a thickness of 350 micrometers.

Then, an n-type nitride semiconductors 121 formed of an n-type GaN having a thickness of 2 micrometers was epitaxially grown at a growth temperature of 1,040 Celsius degrees on the n-type GaN substrate 110. This n-type nitride semiconductor layer 121 had a silicon concentration of $2.0 \times 10^{18}$ $cm^{-3}$.

The active layer 122 was epitaxially grown at a growth temperature of 720 Celsius degrees on the n-type nitride semiconductor layer 121. In more detail, nine InGaN layers each having a thickness of 3 nanometers and nine GaN layers each having thickness of 3 nanometers were alternately stacked to form the active layer 122.

A p-type AlGaN layer having a thickness of 20 nanometers was epitaxially grown on the active layer 122. Subsequently, a p-type GaN layer having a thickness of 250 nanometers was epitaxially grown on the p-type AlGaN layer. In this way, the p-type nitride semiconductor layer 121 was formed and the nitride semiconductor stacking structure 120 shown in FIG. 7A was obtained. The p-type AlGaN layer and the p-type GaN layer contained magnesium as a dopant.

Then, as shown in FIG. 7B, a part of the nitride semiconductor stacking structure 120 was removed by a photolithography method and by a dry etching method to expose a part of the n-type nitride semiconductors 121.

As shown in FIG. 7C, the n-side electrode 130 was formed on the n-type nitride semiconductor layer 123. The n-side electrode 130 is composed of an aluminum layer having a thickness of 500 nanometers. The p-side electrode 140 was formed on the p-type nitride semiconductor layer 121. The p-side electrode 140 was composed of a silver layer having a thickness of 400 nanometers.

The stacking structure thus obtained was subjected to heat treatment at a temperature of 500 Celsius degrees for 20 minutes. A protection electrode layer (not shown) was formed on the n-side electrode 130. This protection electrode layer was composed of a gold layer having a thickness of 40 nanometers and a titanium layer having a thickness of 750 nanometers. The protection electrode layer was also formed on the p-side electrode 140.

The reverse surface of the n-type GaN substrate 110 was polished. After the polishing, the n-type GaN substrate 110 had a thickness of 100 micrometers. In the present specification, the reverse surface of the n-type GaN substrate 110 means a surface where the nitride semiconductor structure 120 is not formed. The obverse surface of the n-type GaN substrate 110 means a surface where the nitride semiconductor structure 120 is formed.

As shown in FIG. 7F and FIG. 7G, the reverse surface of the n-type GaN substrate 110 was irradiated with the second laser beam 210. The focus point of the second laser beam 210, namely, the second spot 211 was formed on the reverse surface the n-type GaN substrate 110. The second laser beam 210 was scanned along the Y-axis (C-axis) to form the second groove 161 on the reverse surface of the n-type GaN substrate 110. The second groove 161 had a depth of 20 micrometers.

Table 20 shows the scanning condition of the second laser beam 210.

TABLE 20

| Laser output | 1 W |
|---|---|
| Laser scanning speed | 100 millimeters/second |

Then, as shown in FIG. 7D and FIG. 7E, the reverse surface of the n-type GaN substrate 110 was irradiated with the first laser beam 200. The first laser beam 200 was scanned along the X-axis (A-axis) to form the first groove 160 on the reverse surface of the n-type GaN substrate 110. In other words, the inclined surfaces 156 were formed on the n-type GaN substrate 110.

Table 21 shows the second scanning condition of the laser beam 210 and the values of the angle θ and L3 cos θ of the formed first groove 160.

TABLE 21

| Laser output | 3 W |
|---|---|
| Laser scanning speed | 150 millimeters/second |
| Distance between the focus point of the first laser beam 200 and the reverse surface of the n-type GaN substrate 110 | 0.3 millimeters |
| θ | 14 degrees |
| L3cosθ | 20 micrometers |

Finally, a breaking was performed along the first groove 160 and the second groove 161 to divide a plurality of the nitride semiconductor light-emitting diodes. In this way, the nitride semiconductor light-emitting diode 100 according to the example C1 was fabricated.

The optical power of the nitride semiconductor light-emitting diode 100 according to the example C1 was measured using an integrating sphere system (available from Optronic Laboratories Inc., under the brand name: OL 770 LED Highspeed LED test and Measurement System). As a result, the optical power was 208.3 mW at 350 mA.

The polarization degree of the nitride semiconductor light-emitting diode 100 according to the example C1 was measured using a goniometer (available from Optronic Laboratories Inc., under the brand name: OL 770-30) and a polarization plate under the condition of CIE Condition A. As a result, the polarization degree was 0.650572.

Example C2

A nitride semiconductor light-emitting diode 100 was fabricated similarly to the example C1, except that the condition shown in TABLE 22 was employed. TABLE 22 also shows the angle θ and L3 cos θ of the nitride semiconductor light-emitting diode 100 according to the example C2.

TABLE 22

| Laser output | 3 W |
|---|---|
| Laser scanning speed | 100 millimeters/s |
| Distance between the focus point of the first laser beam 200 and the reverse surface of the n-type GaN substrate 110 | 0.3 millimeters |
| θ | 20 degrees |
| L3cosθ | 40 micrometers |

Example C3

Figure 9:
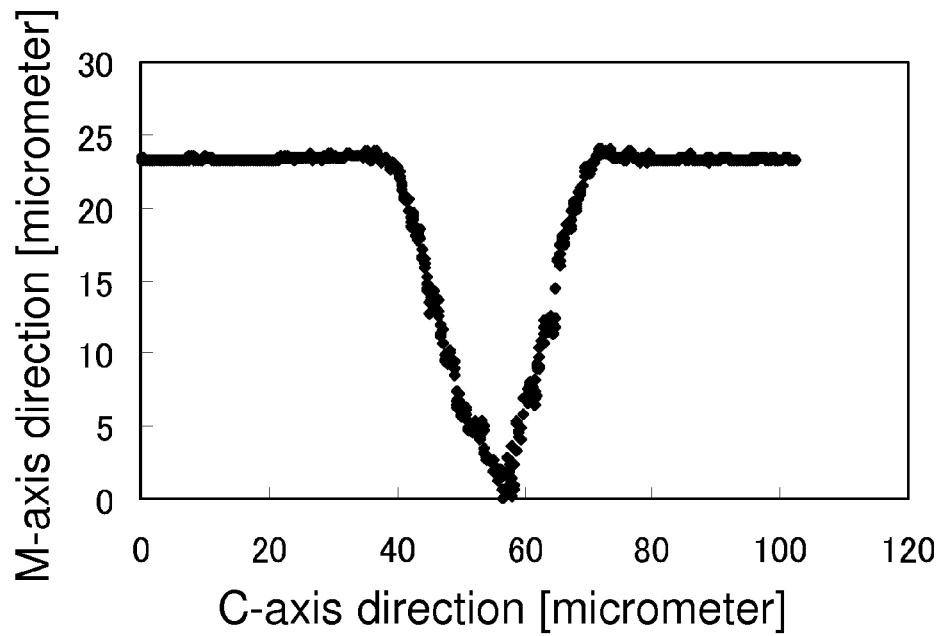
FIG. 9 shows a cross-sectional profile in the example C3.
Figure 10:
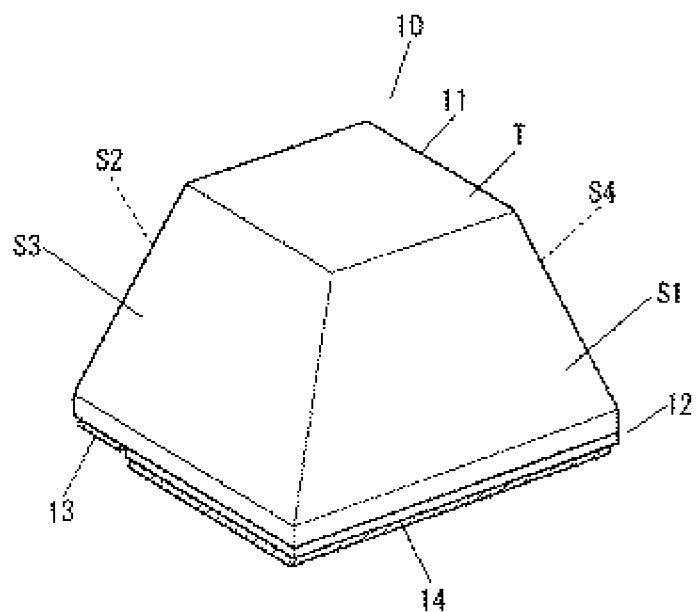
FIG. 10 is a duplicate of FIG. 2 included in Japanese Patent Laid-Open Publication No. 2013-038208.
Figure 11:
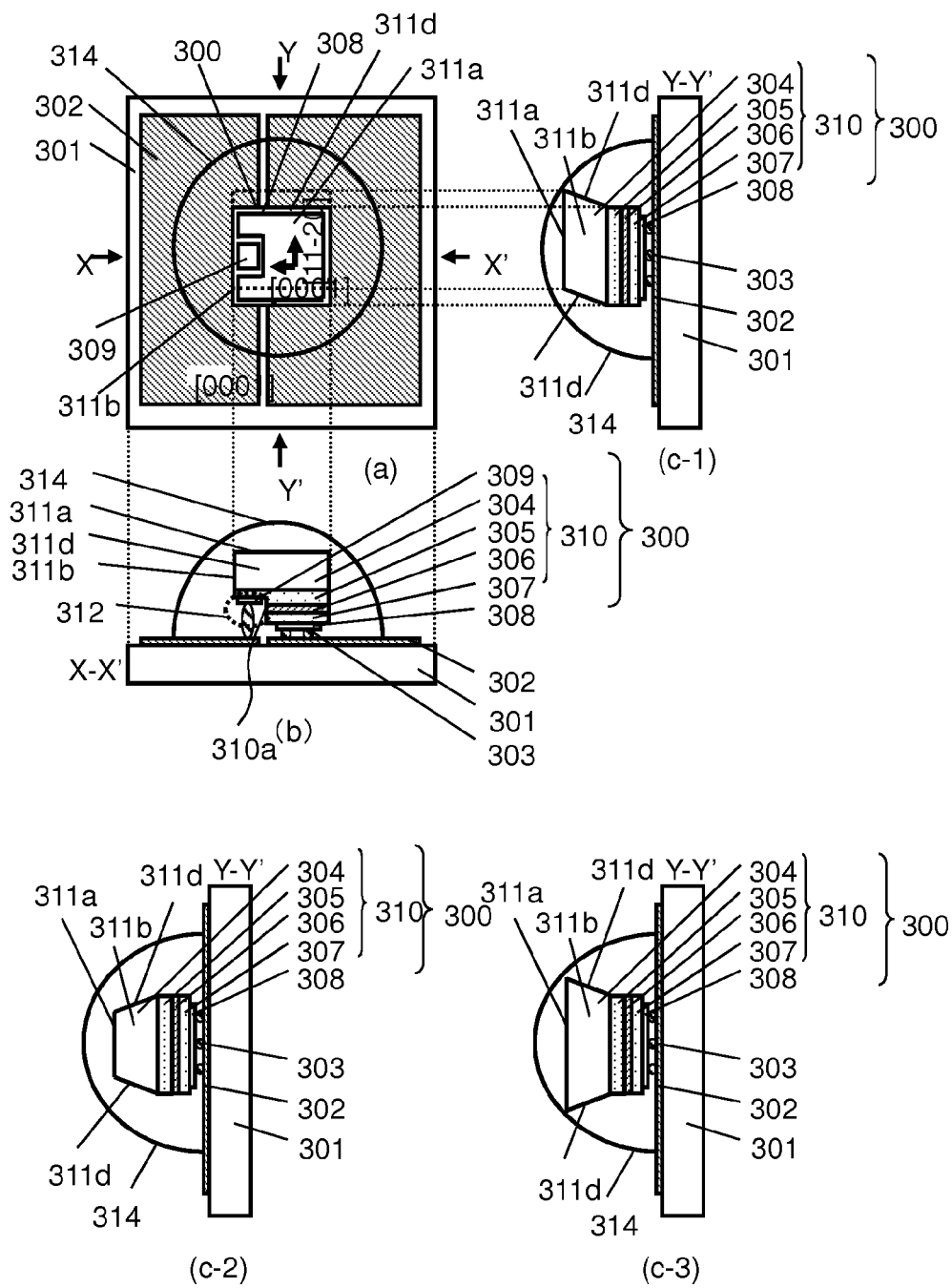
FIG. 11 is a duplicate of FIG. 5 included in WO 2012/137406.

A nitride semiconductor light-emitting diode 100 was fabricated similarly to the example C1, except that the condition shown in TABLE 23 was employed. TABLE 23 also shows the angle θ and L3 cos θ of the nitride semiconductor light-emitting diode 100 according to the example C3. FIG. 9 shows a cross-sectional profile in the example C3.

TABLE 23

| Laser output | 3 W |
|---|---|
| Laser scanning speed | 50 millimeter s/s |
| DDistance between the focus point of the first laser beam 200 and the reverse surface of the n-type GaN substrate 110 | 0.3 millimeters |
| θ | 37 degrees |
| L3cosθ | 60 micrometers |

Comparative Example C1

A nitride semiconductor light-emitting diode was fabricated similarly to the example C1, except that the first grooves 160 were formed along the X-axis (A-axis) and Y axis (C-axis) and that the second groove 161 was not formed. In this way, the nitride semiconductor light-emitting diode shown in FIG. 6 was obtained.

Comparative Example C2

A nitride semiconductor light-emitting diode was fabricated similarly to the example C2, except that the first grooves 160 were formed along the X-axis (A-axis) and Y axis (C-axis) and that the second groove 161 was not formed. In this way, the nitride semiconductor light-emitting diode shown in FIG. 6 was obtained.

Comparative Example C3

A nitride semiconductor light-emitting diode was fabricated similarly to the example C3, except that the first grooves 160 were formed along the X-axis (A-axis) and Y axis (C-axis) and that the second groove 161 was not formed. In this way, the nitride semiconductor light-emitting diode shown in FIG. 6 was obtained.

Comparative Example C4

A nitride semiconductor light-emitting diode was fabricated similarly to the example C1, except that the first grooves 160 were formed along the Y-axis (C-axis) and that the second grooves 161 were formed along the X-axis (A-axis). In this way, the nitride semiconductor light-emitting diode shown in FIG. 5 was obtained. The angle formed between the perpendicular surface 154a and the M-axis was 20 degrees in the comparative example C4. The depth of the first groove 160 including the inclined surfaces 156 was 40 micrometers.

Comparative Example C5

A nitride semiconductor light-emitting diode was fabricated similarly to the example C1, except that the first groove 160 was not formed and that the second grooves 161 were formed along the X-axis (A-axis) and the Y-axis (C-axis).

Table 24 shows optical power of the nitride semiconductor light-emitting diodes according to the example C1—example C3 and comparative example C1—comparative example C5.

TABLE 24

| | Angle θ | L3cosθ | Optical power | Polarization degree |
|---|---|---|---|---|
| Example C1 (FIG. 1) | 14 | 20 | 208.3 | 0.650572 |
| Comparative example C1 (FIG. 6) | 14 | 20 | 200.1 | 0.643853 |
| Example C2 (FIG. 1) | 20 | 40 | 210.0 | 0.65841 |
| Comparative example C2 (FIG. 6) | 20 | 40 | 196.7 | 0.650283 |
| Example C3 (FIG. 1) | 37 | 60 | 200.1 | 0.675046 |
| Comparative example C3 (FIG. 6) | 37 | 60 | 197.2 | 0.670934 |
| Comparative example C4 (FIG. 5) | — | — | 172.0 | 0.654083 |
| Comparative example C5 | — | — | 171.3 | 0.649007 |

As is clear from TABLE 24, the nitride semiconductor light-emitting diode 100 shown in FIG. 1 has a higher optical power and a higher polarization degree than the nitride semiconductor light-emitting diode having no inclined surfaces (comparative example C5). The nitride semiconductor light-emitting diode 100 shown in FIG. 1 also has a higher optical power and a higher polarization degree than the nitride semiconductor light-emitting diodes shown in FIG. 5 and FIG. 6.

INDUSTRIAL APPLICABILITY

The present invention is used for an illumination device.

The invention claimed is:

1. A nitride semiconductor light-emitting diode, comprising:
   an n-side electrode;
   a p-side electrode;
   a nitride semiconductor stacking structure formed of a plurality of nitride semiconductor layers each having a principal surface of a non-polar plane or a semi-polar plane;
   an active layer which is included in the nitride semiconductor stacking structure and generates a polarized light;
   a first side surface;
   a second side surface;
   a third side surface; and
   a fourth side surface, wherein
   X-axis is parallel to a polarization direction of the polarized light;
   Z-axis is parallel to a normal direction of the principal surface;
   Y-axis is perpendicular to both of the X-axis and the Z-axis;
   the nitride semiconductor light-emitting diode comprises a light extraction surface through which the polarized light is emitted toward the outside of the nitride semiconductor light-emitting diode;
   the light extraction surface has a normal line parallel to the Z-axis;
   the first side surface consists only of a plane including the Z-axis and the Y-axis;
   the second side surface consists only of a plane including the Z-axis and the Y-axis;
   the second side surface is disposed parallel to the first side surface (150a);
   the third side surface is perpendicular to the first and second side surfaces and includes the X-axis;
   the fourth side surface is perpendicular to the first and second side surfaces and includes the X-axis;
   the third side surface includes an inclined surface;
   the fourth side surface includes an inclined surface;
   the third and fourth side surfaces are symmetric with respect to a plane which includes the Z-axis and the X-axis; and
   the following mathematical formulae (I), (II), and (III) are satisfied:

$$15 \text{ degrees} \leq \theta \leq 70 \text{ degrees} \qquad (I)$$

$$0.1 \leq (L3 \cos \theta)/h1 \leq 0.5 \qquad (II)$$

$$L2 < L1 \qquad (III)$$

where
   θ represents an angle formed between the inclined surface and the Z-axis in a cross-sectional view including the Z-axis and the Y-axis;
   h1 represents a height of the nitride semiconductor light-emitting diode in the cross-section;
   L1 represents a width of the nitride semiconductor light-emitting diode in the cross-section;
   L2 represents a width of the light extraction surface in the cross-section; and
   L3 represents a length of the inclined surface in the cross-section.

2. The nitride semiconductor light-emitting diode according to claim 1, wherein
   θ is not less than 20 degrees and not more than 50 degrees.

3. The nitride semiconductor light-emitting diode according to claim 1, wherein
   θ is not less than 28 degrees and not more than 45 degrees.

4. The nitride semiconductor light-emitting diode according to claim 1, wherein
   the value of (L3 cos θ) is not less than 0.20 and not more than 0.40.

5. The nitride semiconductor light-emitting diode according to claim 1, wherein
   the value of (L3 cos θ) is not less than 0.26 and not more than 0.37.

6. The nitride semiconductor light-emitting diode according to claim 1, wherein the X axis, the Y-axis, and the Z-axis are an A-axis, a C-axis, and an M-axis, respectively.

7. The nitride semiconductor light-emitting diode according to claim 1, wherein each of the third and fourth side surfaces comprises a vertical surface which includes the Z-axis and the X-axis.

8. The nitride semiconductor light-emitting diode according to claim 1, wherein
the light extraction surface is flat.

\* \* \* \* \*